(12) United States Patent
Park

(10) Patent No.: US 12,272,280 B2
(45) Date of Patent: Apr. 8, 2025

(54) DISPLAY DEVICE

(71) Applicant: LG Display Co., Ltd., Seoul (KR)

(72) Inventor: Sanghyun Park, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/388,967

(22) Filed: Nov. 13, 2023

(65) Prior Publication Data

US 2024/0221556 A1 Jul. 4, 2024

(30) Foreign Application Priority Data

Dec. 30, 2022 (KR) .................. 10-2022-0190193

(51) Int. Cl.
*G09G 3/00* (2006.01)
*G09G 3/20* (2006.01)
*G09G 3/3233* (2016.01)
*H05K 5/02* (2006.01)

(52) U.S. Cl.
CPC ........... *G09G 3/006* (2013.01); *G09G 3/2096* (2013.01); *G09G 3/3233* (2013.01); *H05K 5/0212* (2022.08); *G09G 2300/0819* (2013.01); *G09G 2300/0842* (2013.01); *G09G 2310/0251* (2013.01); *G09G 2310/08* (2013.01); *G09G 2330/08* (2013.01); *G09G 2330/12* (2013.01)

(58) Field of Classification Search
CPC .. H10K 59/00–95; H10K 71/861; F26B 5/04; F26B 23/04; F26B 3/34; F26B 3/347; G06F 1/26; G06F 1/1643; G06F 1/305; G06F 1/28; G06F 1/263; G06F 3/0443; G06F 3/041; G06F 3/0446; H05K 5/0212; H03K 5/08; H01B 7/02; H01B 7/17; H01B 7/18; H01B 7/183; H01B 7/28; H01B 7/2806; H01B 7/29; H01B 7/292; H01B 9/00; H05B 2203/035; H05B 47/19; H05B 45/37; G09G 3/006; G09G 2330/12; G09G 2330/04; G09G 3/30; G02F 1/136254; G01R 31/52; G01R 31/50; G01R 31/00

See application file for complete search history.

(56) References Cited

U.S. PATENT DOCUMENTS

| | | | |
|---|---|---|---|
| 2018/0151636 A1* | 5/2018 | Park | G09G 3/3291 |
| 2022/0157215 A1* | 5/2022 | Park | G09G 3/3266 |
| 2023/0196974 A1* | 6/2023 | Im | G09G 3/3233 |
| | | | 345/212 |

FOREIGN PATENT DOCUMENTS

| | | | | |
|---|---|---|---|---|
| CN | 114999357 A | * | 9/2022 | |
| CN | 107274818 B | * | 8/2023 | ............. G09G 3/006 |
| KR | 20050066664 A | * | 6/2005 | |
| KR | 10-2022-0051550 A | | 4/2022 | |
| KR | 10-2022-0060133 A | | 5/2022 | |
| KR | 20220083211 A | * | 6/2022 | |

* cited by examiner

*Primary Examiner* — Sanjiv D. Patel
(74) *Attorney, Agent, or Firm* — Birch, Stewart, Kolasch & Birch, LLP

(57) ABSTRACT

Discussed is a short-circuit failure preventing method for reference voltage lines in a display device. The method includes identifying whether moisture permeates the reference voltage lines, and removing the moisture from the reference voltage lines when it is identified that the moisture permeates the reference voltage lines. Removing the moisture from the reference voltage lines includes applying a reference voltage to the reference voltage lines.

19 Claims, 8 Drawing Sheets

DISPLAY DEVICE

CROSS REFERENCE TO RELATED APPLICATION

The present application claims priority to Korean Patent Application No. 10-2022-0190193, filed in the Republic of Korea on Dec. 30, 2022, the entire contents of which is hereby expressly incorporated by reference into the present application.

BACKGROUND OF THE DISCLOSURE

Field

The disclosure relates to a display device. For example, the disclosure relates to a display device having short-circuit failure preventing capability for references lines of the display device.

Discussion of the Related Art

With development of various multimedia contents requiring improved display devices, display devices having improved capabilities are becoming increasingly important. Accordingly, various types of display devices such as an organic light emitting display (OLED) and a liquid crystal display (LCD) are being used to accommodate the various multimedia contents.

The display device refers to a device that displays an image, and includes a self-luminance display device including a light emitting diode among others. The self-luminance display device can include an organic light emitting display device that uses an organic material as a light emitting material in the light emitting diode, an inorganic light emitting display device that uses an inorganic material as the light emitting material, or the like.

SUMMARY OF THE DISCLOSURE

An aspect of the disclosure is to provide a short-circuit failure preventing method of reference voltage lines based on removal of moisture from the reference voltage lines.

The problems to be solved in the disclosure are not limited to those mentioned above, and other technical problems not mentioned will become apparent to those skilled in the art from the following description.

According to an embodiment of the present disclosure, a short-circuit failure preventing method of reference voltage lines includes identifying whether moisture permeates the reference voltage lines; and removing the moisture from the reference voltage lines when it is identified that the moisture permeates the reference voltage lines, in which the removal of the moisture from the reference voltage lines includes applying a first reference voltage to the reference voltage lines.

Details of other embodiments of the present disclosure are included in the detailed description and the accompanying drawings.

By a short-circuit failure preventing method of reference voltage lines according to embodiments of the present disclosure, humidity around the reference voltage lines is lowered even though the reference voltage lines are short-circuited due to the humidity, thereby preventing the reference voltage lines from a short-circuit failure.

Effects according to embodiments of the present disclosure are not limited to the example descriptions, and more various effects are involved in the disclosure.

BRIEF DESCRIPTION OF THE DRAWINGS

Embodiments of the present disclosure will become more fully understood from the detailed description given hereinbelow and the accompanying drawings which are given by way of illustration only, and thus are not limitative of the present disclosure.

DETAILED DESCRIPTION OF THE EMBODIMENTS

Figure 1:
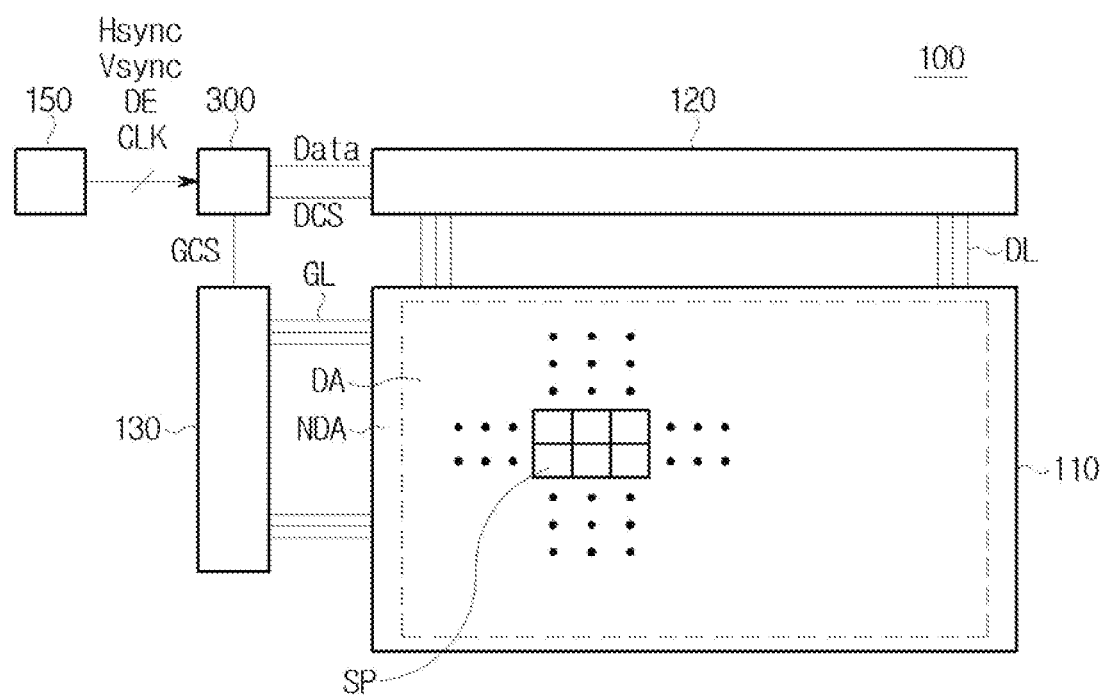
FIG. 1 is a system configuration diagram of a display device according to embodiments of the present disclosure.

Advantages and features of the disclosure and methods of accomplishing the same can be understood more readily by reference to the detailed description of embodiments that will be made hereinafter with reference to the accompanying drawings. The disclosure may, however, be embodied in many different forms and should not be construed as being limited to the example embodiments set forth herein; rather, these example embodiments are provided so that the disclosure will be thorough and complete and will fully convey the concept of the invention to those skilled in the art, and the present disclosure will only be defined by the appended claims.

When an element or layer is referred to as being "on" another element or layer, it includes cases where one element or layer is directly located on the other element or layer or still other element or layer is interposed between the two elements or layers. Throughout the specification, the same reference numerals refer to the same components. The shapes, sizes, proportions, angles, numbers, etc. illustrated in the accompanying drawings to describe the embodiments are merely illustrative, and the disclosure is not limited to those illustrated.

Although the terms "first", "second", and the like are used to describe various components, these components are not limited by these terms. These terms are merely used for distinguishing one component from the other components. Therefore, the first component mentioned hereinafter can be the second component in the technical sense of the disclosure.

The features of various embodiments of the present disclosure can be partially or entirely combined or assembled in various technical manners of interlocking and interoperation, and each embodiment can be implemented independently or in combination with related embodiments.

In describing the locational relationship between components, when two or more components are described as being "connected", "combined", or "coupled" to each other, it should be understood that two or more components can be directly "connected", "combined", or "coupled" to each other, and that two or more components can be "connected", "combined", or "coupled" to each other with another component "interposed" therebetween. In this case, another component can be included in at least one of the two or more components that are "connected", "combined", or "coupled" to each other.

In the description of a sequence of operating methods or manufacturing methods, for example, the expressions using "after", "subsequent to", "next", "before", and the like can also encompass the case in which operations or processes are performed discontinuously unless "immediately" or "directly" is used in the expression.

Numerical values for components or information corresponding thereto (e.g., levels or the like), which are mentioned herein, can be interpreted as including an error range caused by various factors (e.g., process factors, internal or external impacts, noise, etc.) even if an explicit description thereof is not provided.

Hereinafter, detailed embodiments of the present disclosure will be described with reference to the accompanying drawings.

FIG. 1 is a system configuration diagram of a display device according to embodiments of the present disclosure.

Referring to FIG. 1, a display device 100 according to embodiments of the present disclosure can include a display panel 110, and driving circuits 120 and 130 for driving the display panel 110. All components of each display device according to all embodiments of the present disclosure are operatively coupled and configured.

The driving circuits can include a data driving circuit 120 and a gate driving circuit 130, and can further include a controller 300 for controlling the data driving circuit 120 and the gate driving circuit 130.

The display panel 110 can include a substrate, and a plurality of data lines DL, a plurality of gate lines GL, and the like signal wirings disposed on the substrate. The display panel 110 can include a plurality of sub-pixels SP connected to the plurality of data lines DL and the plurality of gate lines GL.

The display panel 110 can include a display area DA where an image is displayed, and a non-display area NDA where no images are displayed. In the display panel 110, the plurality of sub-pixels SP for displaying an image are disposed in the display area DA, and the driving circuits 120 and 130 are disposed in the non-display area NDA. The driving circuits 120 and 130 can be electrically connected to or, mounted to integrated circuits or printed circuits. Also a pad for connection with the integrated circuits or the printed circuits are also disposed in the non-display area NDA.

To control operation timing of the data driving circuit 120, the controller 300 can supply a data control signal DCS to the data driving circuit 120. The controller 300 can supply a gate control signal GCS for controlling the operation timing of the gate driving circuit 130 to the gate driving circuit 130.

The controller 300 can start scanning according to timing implemented in each frame, convert input image data received from the outside into that suitable for a data signal format used in the data driving circuit 120, supply the converted image data Data to the data driving circuit 120, and control data driving at an appropriate time according to the scan.

The controller 300 receives various timing signals such as a vertical synchronization signal VSYNC, a horizontal synchronization signal HSYNC, an input data enable signal DE, and a clock signal CLK along with the input image data from the outside (e.g., a host system 150).

To control the data driving circuit 120 and the gate driving circuit 130, the controller 300 receives the vertical synchronization signal VSYNC, the horizontal synchronization signal HSYNC, the input data enable signal DE, the clock signal CLK, and the like timing signal, generates various control signals DCS and GCS, and outputs the generated control signals DCS and GCS to the data driving circuit 120 and the gate driving circuit 130.

For example, to control the gate driving circuit 130, the controller 300 outputs various gate control signals GCS such as a gate start pulse (GSP), a gate shift clock (GSC), and a gate output enable signal (GOE).

Further, to control the data driving circuit 120, the controller 300 outputs various data control signals (DCS) such as a source start pulse (SSP), a source sampling clock (SSC), and a source output enable signal (SOE).

The controller 300 can be implemented as a separate component from the data driving circuit 120, or can be integrated into the data driving circuit 120 and implemented as an integrated circuit.

The data driving circuit 120 receives image data Data from the controller 300 and supplies a data voltage to the plurality of data lines DL, thereby driving the plurality of data lines DL. Here, the data driving circuit 120 can also be referred to as a source driving circuit (or a source driver).

Figure 2:
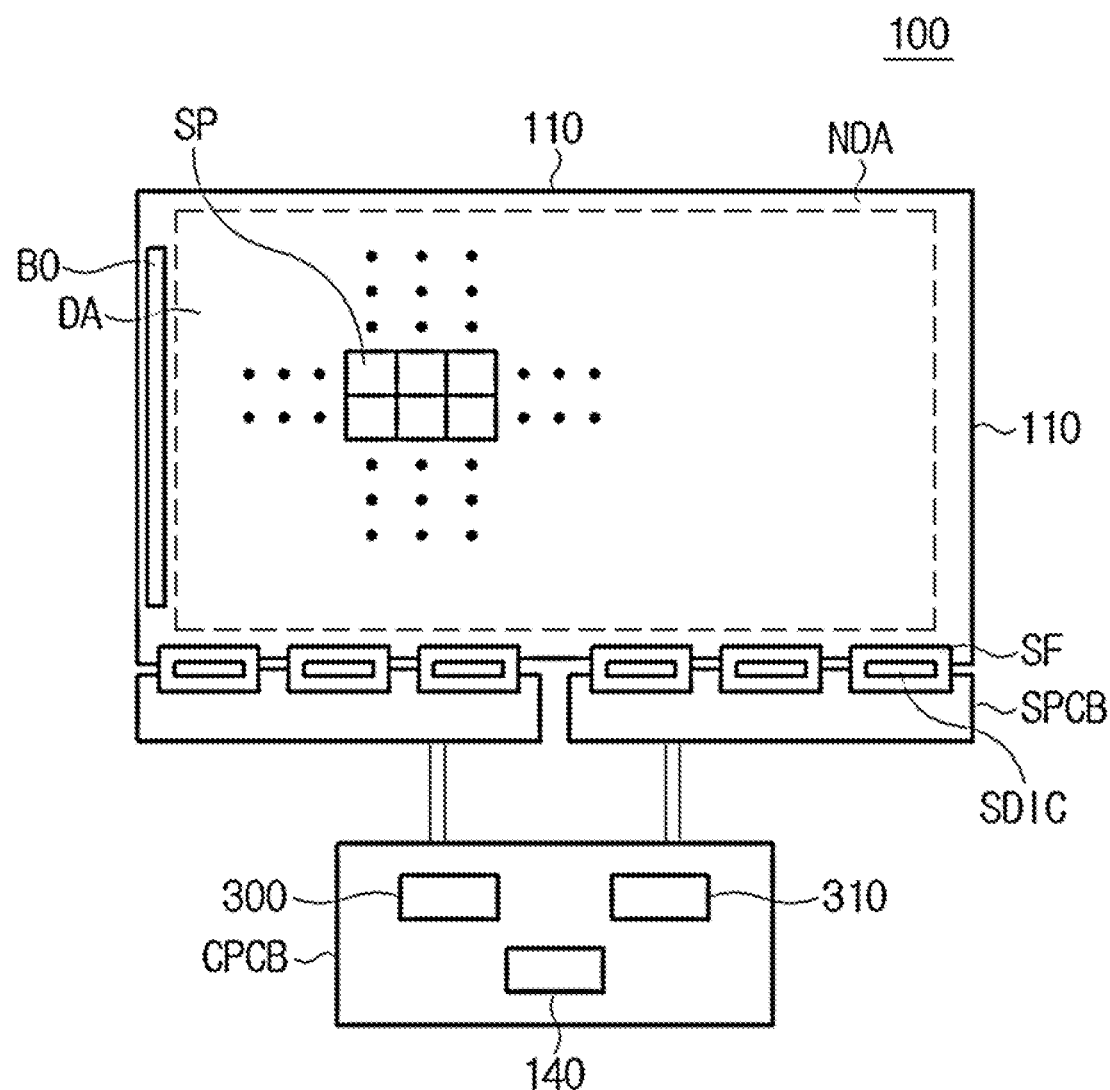
FIG. 2 illustrates an example of implementing a system for a display device according to embodiments of the present disclosure.

The data driving circuit 120 can include one or more source driver integrated circuits (SDIC) (see FIG. 2).

The gate driving circuit 130 can output a gate signal of a turn-on level voltage or output a gate signal of a turn-off level voltage under control of the controller 300. The gate driving circuit 130 supplies the gate signals of the turn-on level voltages to the plurality of gate lines GL in sequence, thereby driving the plurality of gate lines GL sequentially.

The gate driving circuit 130 can be connected to the display panel 110 by a tape automated bonding (TAB) method, can be connected to a bonding pad of the display panel 110 by a chip-on-glass (COG) or chip-on-panel (COP) method, or can be connected to the display panel 110 by a chip-on-film (COF) method. Alternatively, the gate driving circuit 130 can be formed in the non-display area NDA of the display panel 110 as a gate in panel (GIP) type. The gate driving circuit 130 can be disposed on a substrate SUB or can be connected to the substrate SUB. In other words, in the case of the GIP type, the gate driving circuit 130 can be disposed in the non-display area NDA of the substrate SUB. In the case of the COG type, the COF type, etc., the gate driving circuit 130 can be connected to the substrate SUB.

The data driving circuit 120 can convert the image data Data received from the controller 300 into analog data voltage and supply the analog data voltage to the plurality of data lines DL when particular gate lines GL are opened by the gate driving circuit 130.

The data driving circuit 120 can be connected to one side (e.g., an upper or lower side) of the display panel 110. According to driving types, panel design types, etc., the data driving circuit 120 can be connected to both sides (e.g., the upper and lower sides) of the display panel 110, or can be connected to two or more sides among four sides of the display panel 110.

The gate driving circuit 130 can be connected to one side (e.g., a left or right side) of the display panel 110. According to driving types, panel design types, etc., the gate driving circuit 130 can be connected to both sides (e.g., the left and right sides) of the display panel 110, or can be connected to two or more sides among four sides of the display panel 110. But embodiments of the present disclosure are not limited thereto.

The controller 300 can be a timing controller used in typical display technology, a control device that performs other control functions in addition to the function of the timing controller, a control device different from the timing controller, or a circuit in the control device. The controller 300 can be implemented by various circuits or electronic components, such as an integrated circuit (IC), a field programmable gate array (FPGA), an application specific integrated circuit (ASIC), or a processor. But embodiments of the present disclosure are not limited thereto.

The controller 300 can be mounted to a printed circuit board, a flexible printed circuit, or the like, and electrically connected to the data driving circuit 120 and the gate driving circuit 130 through the printed circuit board, the flexible printed circuit, or the like. But embodiments of the present disclosure are not limited thereto.

The controller 300 can transmit and receive a signal to and from the data driving circuit 120 through one or more predetermined interfaces. Here, for example, the interface can include a low voltage differential signaling (LVDS) interface, an embedded clock point-point interface (EPI), a serial peripheral interface (SPI), and the like. But embodiments of the present disclosure are not limited thereto.

The controller 300 can include one or more registers or the like memory medium. But embodiments of the present disclosure are not limited thereto.

The display device 100 according to embodiments can be an organic light emitting diode (OLED) display, a quantum dot display, a micro light emitting diode (LED) display, or the like self-luminance display. But embodiments of the present disclosure are not limited thereto.

When the display device 100 according to embodiments is the OLED display, each sub-pixel SP can include an organic light emitting diode (OLED), which emits light by itself, as the light emitting element. When the display device 100 according to embodiments is the quantum dot display, each sub-pixel SP can include a light emitting diode made of a quantum dot that emits light by itself. When the display device 100 according to embodiments is a micro LED display, each sub-pixel SP can include a micro LED made of an inorganic material and emitting light by itself as the light emitting diode. But embodiments of the present disclosure are not limited thereto.

FIG. 2 illustrates an example of implementing a system for a display device according to embodiments of the present disclosure.

Referring to FIG. 2, the display panel 110 can include a display area DA where an image is displayed, and a non-display area NDA where no images are displayed.

When the data driving circuit 120 includes one or more source driver integrated circuit SDIC and is implemented in the COF method, each source driver integrated circuit SDIC can be mounted on a circuit film SF connected to the non-display area NDA of the display panel 110.

Each source driver integrated circuit SDIC can include a shift register, a latch circuit, a digital-to-analog converter (DAC), an output buffer, etc. Each source driver integrated circuit SDIC can further include an analog-to-digital converter (ADC) as necessary.

For example, each source driver integrated circuit SDIC can be connected to the display panel 110 by the TAB method, can be connected to the bonding pad of the display panel 110 by the COG or COP method, or can be implemented by the COF method and connected to the display panel 110. The gate driving circuit 130 can be implemented in the GIP type. In this case, the gate driving circuit 130 can be formed in the non-display area NDA of the display panel 110. The gate driving circuit 130 can also be implemented as the COF type unlike that of FIG. 2.

The display device 100 can include at least one of the source printed circuit board SPCB for circuitous connection between one or more source driver integrated circuits SDIC and other devices, and a control printed circuit board CPCB for mounting control components and various electronic devices.

At least one source printed circuit board SPCB can connect with a film SF to which the source driver integrated circuit SDIC is mounted. In other words, the film SF to which the source driver integrated circuit SDIC is mounted can have a first side electrically connected to the display panel 110 and a second side electrically connected to the source printed circuit board SPCB.

The control printed circuit board CPCB can be mounted with the controller 300, a power management integrated circuit (PMIC) 310, etc. The controller 300 can perform overall control functions related to driving of the display panel 110, and control the operations of the data driving circuit 120 and the gate driving circuit 130. The PMIC 310 can supply various voltages or currents to the data driving circuit 120 and the gate driving circuit 130 or can control various voltages or currents to be supplied. The controller 300 and the PMIC 310 can be electrically connected. The controller 300 and the PMIC 310 can perform inter-integrated circuit (I2C) communication with each other.

At least one source printed circuit board SPCB and the control printed circuit board CPCB can be circuitously connected via at least one connection cable CBL. Here, the connection cable CBL can be, for example, a flexible printed circuit (FPC), a flexible flat cable (FFC), or the like. But embodiments of the present disclosure are not limited thereto.

At least one source printed circuit board SPCB and the control printed circuit board CPCB can be integrated and implemented in a single printed circuit substrate.

The display device 100 according to embodiments of the disclosure can further include a level shifter 140 for adjusting a voltage level. For example, the level shifter 140 can be disposed on the control printed circuit board CPCB or the source printed circuit board SPCB. A circuit board BO can be provided in the non-display area NDA.

Figure 3:
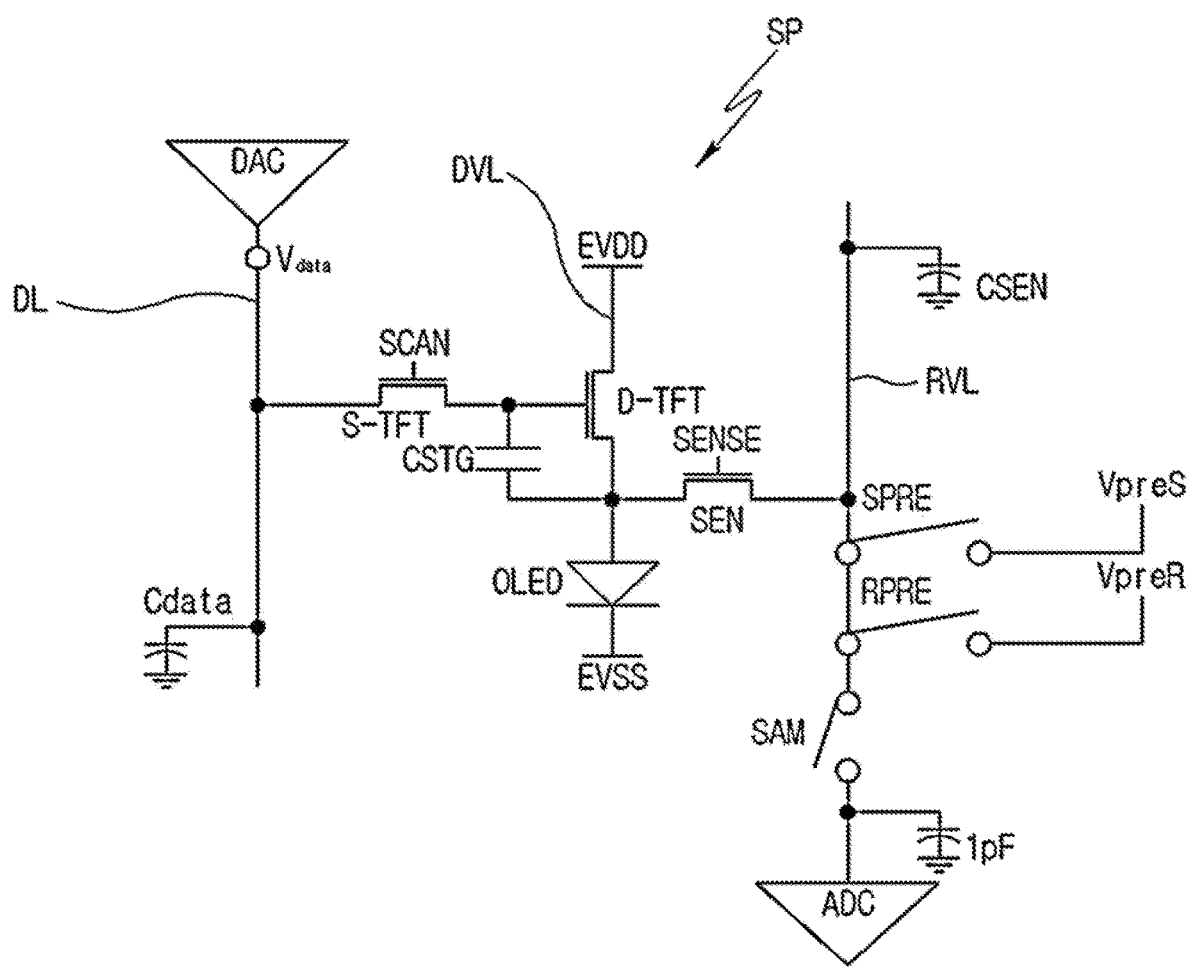
FIG. 3 is an equivalent circuit diagram of a sub-pixel of the display device of FIG. 1.

FIG. 3 is an equivalent circuit diagram of a sub-pixel of the display device of FIG. 1.

Referring to FIG. 1 to FIG. 3, the source driver integrated circuit SDIC includes a sampling switch SAM, an analog-to-digital converter ADC, and reference voltage switches RPRE and SPRE.

The plurality of sub-pixels SP disposed on the display panel 110 of the display device 100 can each include a light emitting diode OLED, a driving transistor D-TFT, a switching transistor S-TFT, and a sensing transistor SEN. But embodiments of the present disclosure are not limited thereto.

A gate electrode of the driving transistor D-TFT can be connected to the switching the transistor S-TFT. A first electrode of the driving transistor D-TFT can be electrically connected to the driving voltage line DVL supplying a first driving voltage EVDD. The second electrode of the driving transistor D-TFT can be a source node or a drain node of the driving transistor D-TFT, electrically connected to a source node or a drain node of the sensing transistor SEN, and electrically connected to the light emitting diode OLED.

A scan signal SCAN can be applied to the gate electrode of the switching transistor S-TFT. The scan signal SCAN can be generated from the gate driving circuit 130 of FIG. 1 and provided through a gate line GL. The switching transistor S-TFT can be electrically connected between a data line DL and the gate electrode of the driving transistor D-TFT. The switching transistor S-TFT can provide data voltage Vdata to the gate electrode of the driving transistor D-TFT.

A storage capacitor CSTG is electrically connected between the gate electrode of the driving transistor D-TFT and the second electrode, and maintains the data voltage Vdata or voltage corresponding to an image signal voltage for one frame time.

The sensing transistor SEN is turned on by a sense signal SENSE, and transmit one of reference voltages VpreS and VpreR supplied by a reference voltage line RVL to the second electrode of the driving transistor D-TFT. These reference voltages VpreS and VpreR can be selected by the two switches SPRE and RPRE.

Further, the sensing transistor SEN can be turned on by the sense signal SENSE to apply the voltage of the second node of the driving transistor D-TFT to the reference voltage line RVL. In this case, the voltage of the second node of the driving transistor D-TFT applied to the reference voltage line RVL can be a voltage for calculating the characteristic value of the sub-pixel SP or a voltage reflecting the characteristic value of the sub-pixel SP. For example, the characteristic value of the sub-pixel SP can be the characteristic value of the driving transistor D-TFT or light emitting diode OLED. The characteristic value of the driving transistor D-TFT can include the threshold voltage and/or mobility of the driving transistor D-TFT. The characteristic value of the light emitting diode OLED can include a threshold voltage of the light emitting diode OLED.

The reference voltage line RVL can be electrically connected to selection switches, one or more sample&holds, the sampling switch SAM, and the analog-to-digital converter ADC through the data pads. The sampling switch SAM controls the electrical connection of the sample&holds to the analog-to-digital converter ADC in sequence.

The source driver integrated circuit SDIC can provide the data voltage Vdata to the data line DL through the digital-to-analog converter DAC. The source driver integrated circuit SDIC can respectively provide the reference voltages VpreR for driving to the reference voltage lines RVL through the reference voltage switch RPRE for driving. The source driver integrated circuit SDIC can provide the data voltage Vdata to the data line DL.

The reference voltage switch RPRE for driving is turned on when the sensing transistor SEN is turned on by the scan signal in a section of driving the image data, so that the reference voltage VpreR for driving is applied to the second electrode of the driving transistor D-TFT.

The reference voltage switch SPRE for sensing controls whether to supply the reference voltage VpreS for sensing to the reference voltage lines RVL, and the sampling switch SAM controls the connection between the reference voltage lines RVL and a sensor to detect the voltage for sensing the characteristics of the sub-pixel SP.

When the reference voltage switch SPRE for sensing is turned on, the reference voltage VpreS for sensing is supplied to the reference voltage lines RVL. The reference voltage VpreS for sensing supplied to the reference voltage lines RVL can be applied to the second electrode of the driving transistor D-TFT through the sensing transistor SEN which is turned on.

When the voltage of the second electrode of the driving transistor D-TFT becomes a voltage state that reflects the characteristics of the sub-pixel SP, the voltage of the reference voltage lines RVL, which can be equipotential with the first node of the driving transistor D-TFT, can also become a voltage state that reflects the characteristics of the sub-pixel SP.

In this case, a line capacitor formed on the reference voltage lines RVL can be charged with a voltage that reflects the characteristics of the sub-pixel SP. In other words, when the sensing transistor SEN is turned on, the voltage of the reference voltage lines RVL can have the same level as the voltage charged in the line capacitor.

When the voltage of the first node of the driving transistor D-TFT is in a voltage state that reflects the characteristics of the sub-pixel SP, the sampling switch SAM can be turned on to connect the sensor and the reference voltage lines RVL. Accordingly, the sensor detects the voltage of the reference voltage lines RVL, which is in the voltage state reflecting the characteristics of the sub-pixel SP. Here, the reference voltage line RVL can be referred to as a sensing line.

If moisture permeation occurs around the reference voltage lines RVL, a short-circuit can be formed between adjacent reference voltage lines RVL. To detect the short-circuit between the adjacent reference voltage lines RVL, a predetermined voltage is applied to the reference voltage lines RVL and floated for a certain period of time to detect the reference voltage lines RVL that can cause miscompensation through changes in the sensing value detected by the reference voltage lines RVL. However, in this case, it is only to detect the reference voltage lines RVL where the short-circuit has occurred, without solving the fundamental problems of moisture permeation, and it is thus impossible to prevent the moisture permeation causing the short-circuit.

According to an embodiment, the short-circuit failure preventing method of the reference voltage lines has the advantage that the moisture permeation causing the short-circuit between the reference voltage lines RVL is prevented in advance through steps STEP1 to STEP3 described below.

Hereinafter, with reference to FIGS. 4 and 5, the short-circuit failure preventing method of the reference voltage lines will be described, according to an embodiment of the present disclosure.

Figure 4:
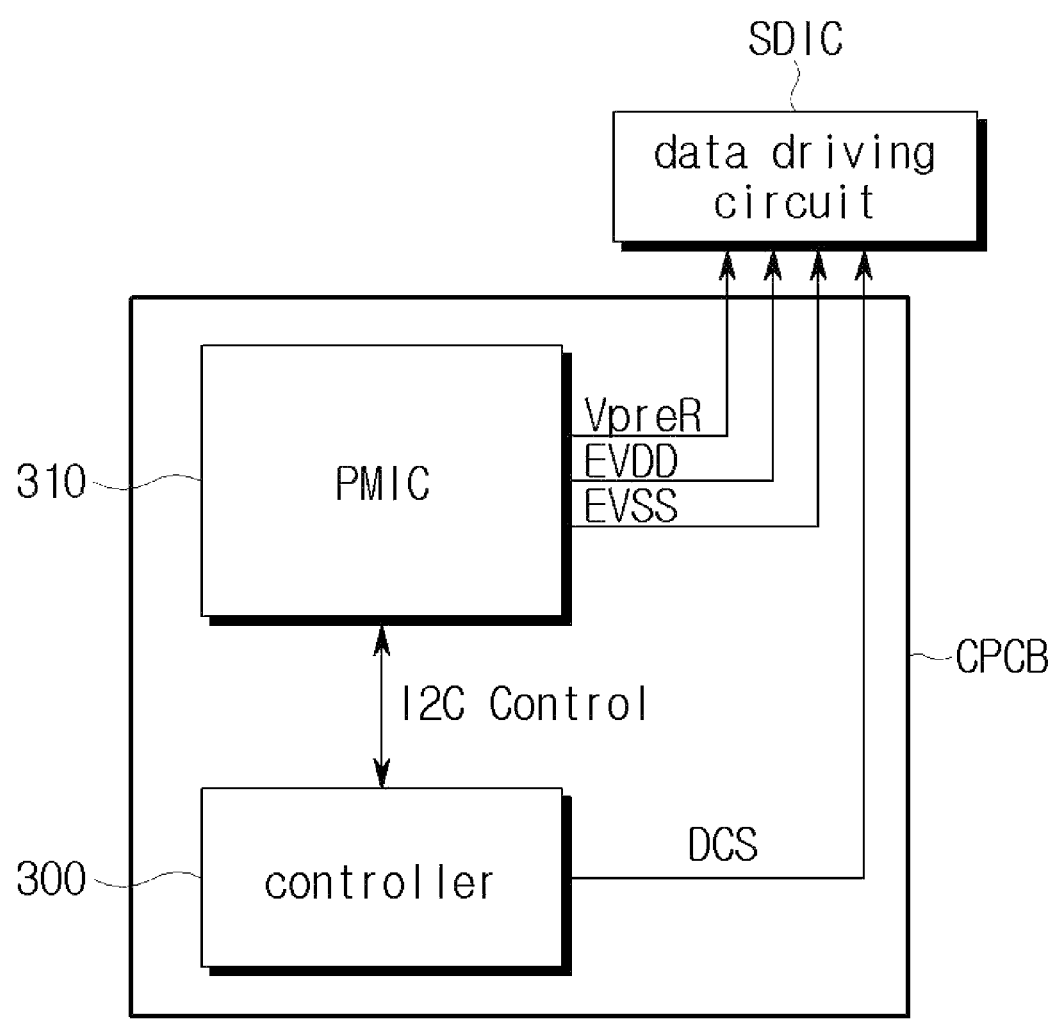
FIG. 4 is a block diagram of a control printed circuit board and a source driver of a display device according to an embodiment of the present disclosure.

FIG. 4 is a block diagram of a control printed circuit board and a source driver of a display device according to an embodiment of the present disclosure. FIG. 5 is a waveform diagram of signals applied to a sub-pixel according to an embodiment of the present disclosure.

Figure 5:
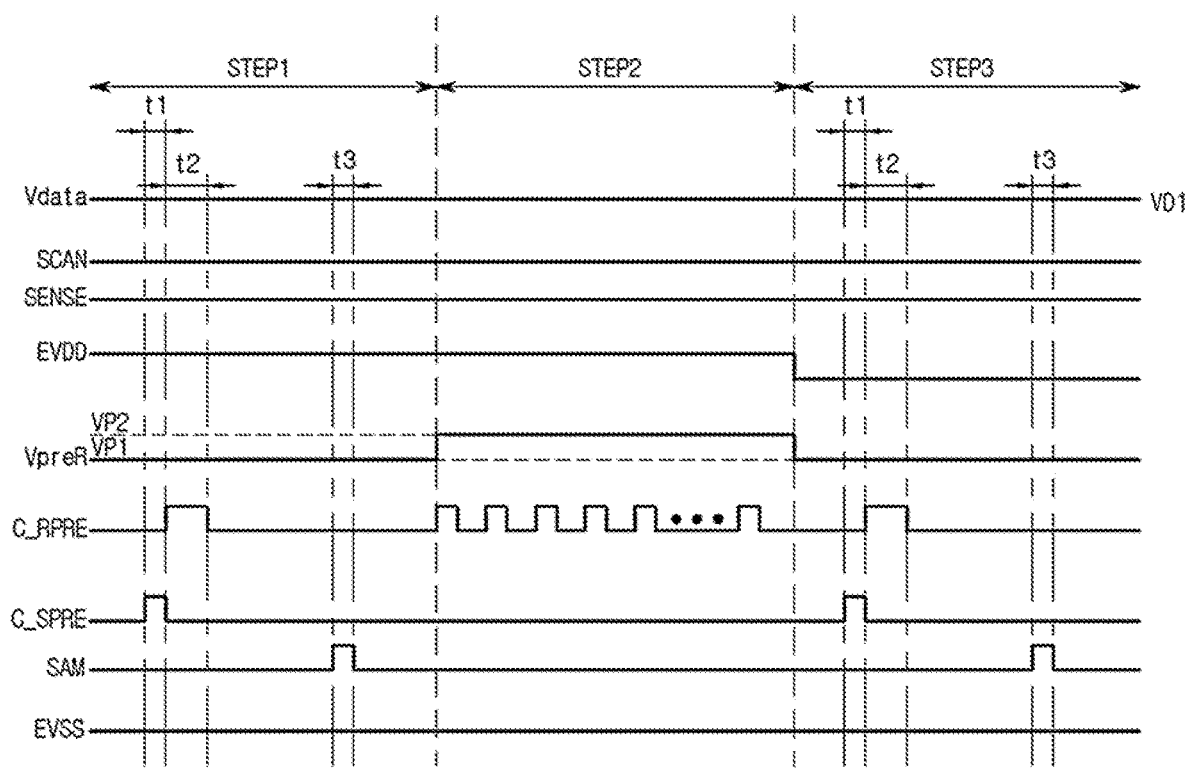
FIG. 5 is a waveform diagram of signals applied to a sub-pixel according to an embodiment of the present disclosure.

Referring to FIG. 4 and FIG. 5, according to an embodiment of the present disclosure, the short-circuit failure preventing method of the reference voltage lines can include a first step STEP1 of identifying whether moisture permeates the reference voltage lines RVL or around the reference voltage lines RVL, a second step STEP2 of removing moisture from the reference voltage lines RVL or from around the reference voltage lines RVL when it is identified that the moisture permeates the reference voltage lines RVL or around reference voltage lines RVL, and a third step STEP3 of reidentifying whether the moisture permeates the reference voltage lines RVL or around the reference voltage lines RVL.

In STEP1, the reference voltage lines RVL are initialized by turning on the reference voltage switch SPRE for sensing. The initialization of the reference voltage lines RVL can include applying the reference voltage VpreS for sensing to the reference voltage lines RVL. For example, a first control signal C_SPRE can control the switching of the reference voltage switch SPRE. The reference voltage switch SPRE can be turned on in response to an on-level (e.g., a high level) of the first control signal C_SPRE and turned off in response to an off-level (e.g., a low level) of the first control signal C_SPRE. In the first step STEP1, when the first control signal C_SPRE has the on-level in a first period t1 and the reference voltage switch SPRE is turned on, the reference voltage VpreS for sensing is supplied to the reference voltage lines RVL.

Then, the reference voltage switch RPRE for driving is turned on. By turning on the reference voltage switch RPRE for driving, the reference voltage VpreR having a first voltage level VP1 is applied to the reference voltage lines RVL. For example, a second control signal C_RPRE can control the switching of the reference voltage switch RPRE for driving. The reference voltage switch RPRE for driving can be turned on in response to the on-level (e.g., the high level) of the second control signal C_RPRE and turned off in response to the off-level (e.g., the low level) of the second control signal C_RPRE.

In a second period t2 of the first step STEP1, when the first control signal C_SPRE has an off-level and the second control signal C_RPRE has an on level, the reference voltage switch SPRE for sensing is turned off, the reference voltage switch RPRE for driving is turned on, and the reference voltage VpreR of the first voltage level VP1 is supplied to the reference voltage lines RVL.

The reference voltage VpreR of the first voltage level VP1 is charged in a capacitor CSEN for sensing. In other words, the voltage charged in the capacitor CSEN for sensing can have a level equal to the first voltage level VP1. After the reference voltage VpreR of the first voltage level VP1 is applied to the reference voltage lines RVL, the reference voltage switch RPRE for driving is turned off in response to the off-level (e.g., the low level) of the second control signal C_RPRE. When the reference voltage switch RPRE for driving is turned off, the voltage charged in the capacitor CSEN for sensing is discharged.

Then, in a third period t3 of STEP1, the sampling switch SAM is turned on to measure a voltage Vsen charged on the reference voltage lines RVL and the sensing capacitor CSEN connected to them.

For example, a third control signal C_SAM can control the switching of the sampling switch SAM. The sampling switch SAM can be turned on in response to the on-level (e.g., the high level) of the third control signal C_SAM and turned off in response to the off-level (e.g., the low level) of the third control signal C_SAM.

By measuring the voltage charged in the sensing capacitor CSEN connected to the reference voltage lines RVL, a discharging amount of voltage charged in the sensing capacitor CSEN connected to each of the reference voltage lines RVL can be identified.

Some reference voltage lines RVL of the plurality of reference voltage lines RVL can have a significantly different level of voltage charged in the sensing capacitor CSEN compared to other reference voltage lines RVL. In this case, some reference voltage lines RVL can be identified as reference voltage lines RVL which are short-circuited. For example, the reference voltage lines RVL whose level of the voltage charged in the capacitor CSEN for sensing is lower than a normal level can be identified as the reference voltage lines RVL in which a short-circuit has occurred.

After detecting the reference voltage lines RVL short-circuited by moisture permeation in the first step STEP1, the second step STEP2 can be performed to remove the moisture from the reference voltage lines RVL.

The second step STEP2 can include applying the reference voltage VpreR having a second voltage level VP2 to the reference voltage lines RVL. The reference voltage VpreR having the second voltage level VP2 in the step STEP2 of removing moisture from the reference voltage lines RVL can be higher than the reference voltage VpreR having a third voltage level applied to the second electrode of the driving transistor D-TFT as the reference voltage switch RPRE for driving described above with reference to FIG. 3 is turned on in the state that the sensing transistor SEN is turned on by the sense signal SENSE in the section of driving the image data. For example, the second voltage level VP2 can be about three to four times the third reference voltage. For example, the second voltage level VP2 can be, but is not limited to, 2.2V.

The reference voltage VpreR having the second voltage level VP2 can be applied when the reference voltage switch RPRE for driving is turned on. According to an embodiment, the on-level and the off-level of the second control signal C_RPRE are supplied alternately to the reference voltage switch RPRE for driving, so that the reference voltage switch RPRE for driving can be repeatedly turned on and off. By repeatedly turning on and off the reference voltage switch RPRE for driving, the capacitor CSEN for sensing connected to the reference voltage lines RVL can be repeatedly charged and discharged. As a result, current can flow continuously in the reference voltage lines RVL. In other words, according to an embodiment, the charging and discharging of the capacitor CSEN for sensing connected to the reference voltage lines RVL can be performed repeatedly so that current can continuously flow in the reference voltage lines RVL, thereby increasing the amount of heat generated in the reference voltage lines RVL. As described above, because the second voltage level VP2 of the reference voltage VpreR is about three to four times the third voltage level of the reference voltage VpreR, the amount of generated heat can be further increased, thereby removing the moisture from the reference voltage lines RVL.

As shown in FIG. 4, the reference voltage VpreR having the second voltage level VP2 can be generated from the PMIC 310 by a control signal of the controller 300 and applied to the source driver integrated circuit SDIC. The controller 300 can be electrically connected to the PMIC 310 via an I2C method.

Figure 6:
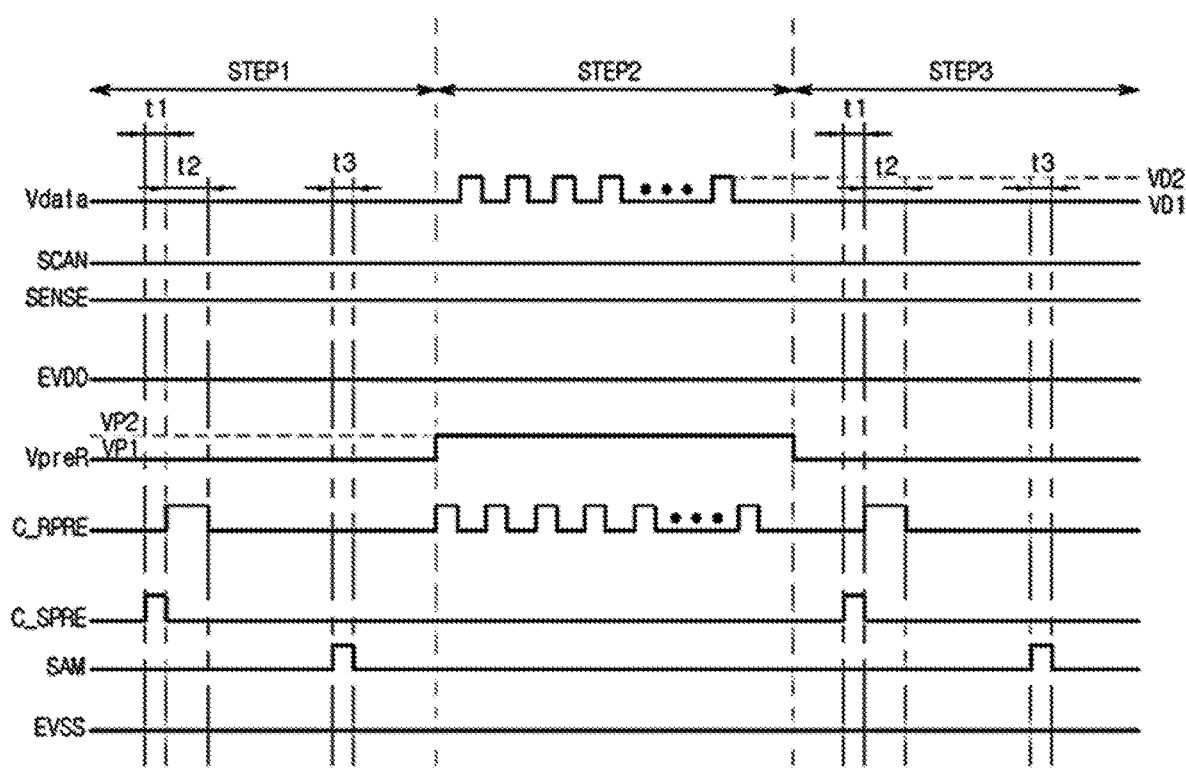
FIG. 6 is a waveform diagram of signals applied to a sub-pixel according to another embodiment of the present disclosure.

FIG. 6 is a waveform diagram of signals applied to a sub-pixel according to another embodiment of the present disclosure.

Referring to FIGS. 4 and 6, in the second step STEP2, the data voltage Vdata can be further applied to the data line DL.

The data voltage having a first voltage level VD1 and the data voltage having a second voltage level VD2, applied to the data line DL, can change alternately. The first voltage level VD1 can be higher than the second voltage level VD2.

The data voltage can be changed based on the data control signal DCS output from the controller 300. The data control signal DCS can include the first control signal C_SPRE, the second control signal C_RPRE, and the third control signal C_SAM.

According to an embodiment of the present disclosure, the data voltage Vdata can be repeatedly alternated between the data voltage having the first voltage level VD1 and the data voltage having the second voltage level VD2, so that the charging and discharging of the capacitor Cdata connected to the data line DL with the data voltage can be repeated, thereby causing the current to flow continuously in the data line DL, and increasing the heat generation of the data line DL. By increasing the amount of generated heat in the data line DL, moisture can be removed from the data line DL and the reference voltage lines RVL adjacent to the data line DL.

Figure 7:
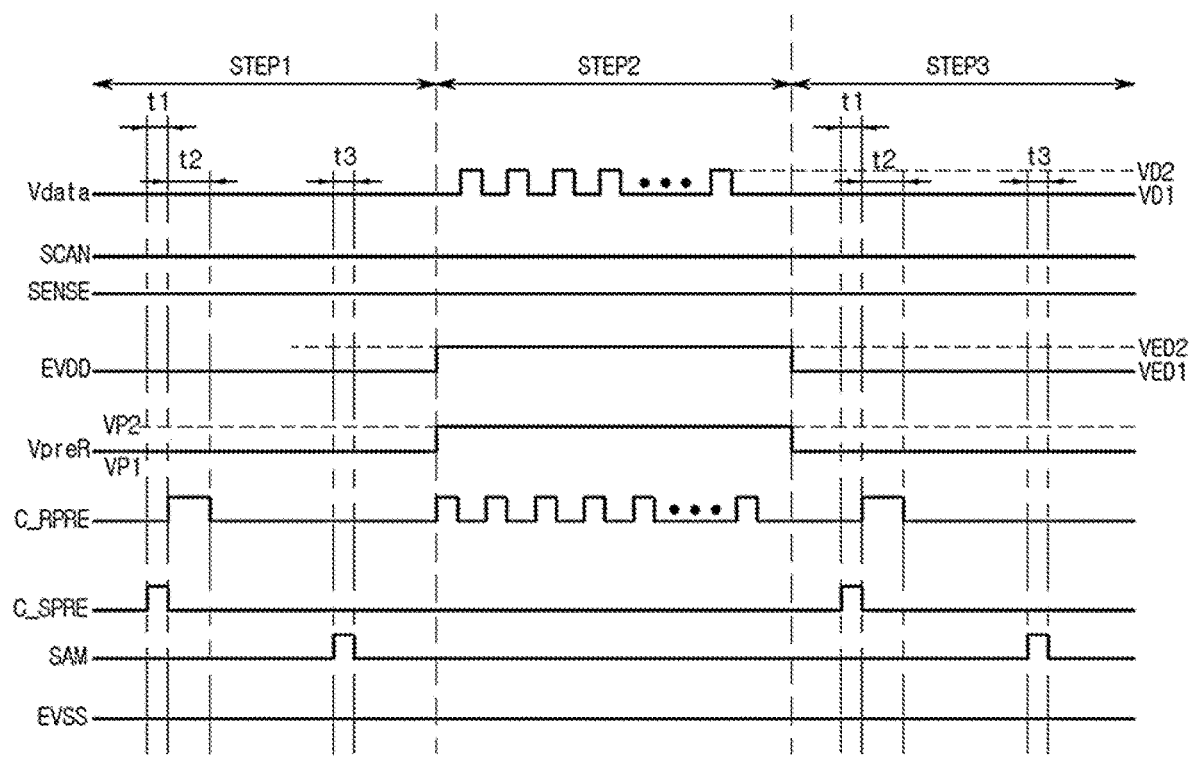
FIG. 7 is a waveform diagram of signals applied to a sub-pixel according to still another embodiment of the present disclosure.

FIG. 7 is a waveform diagram of signals applied to a sub-pixel according to still another embodiment of the present disclosure.

Referring to FIGS. 4 and 7, in the second step STEP2, the first drive voltage EVDD can be further applied to the drive voltage line DVL.

While the first driving voltage EVDD having the third voltage level in the period of driving the light emitting diode OLED is applied to the pixels, in the second step STEP2, the first driving voltage EVDD having the second voltage level VED2 can be further applied to the driving voltage line DVL. The second voltage level VED2 can be greater than the third voltage level. Further, the second voltage level VED2 can be greater than the first voltage level VED1 in the first step STEP1.

For example, the third voltage level can be about 15 to 17 V, while the second voltage level VED2 can be about 20 to 25 V.

In the second step STEP2, the supply of the first driving voltage EVDD having the second voltage level VED2 can be controlled by the PMIC 310 as an increasing control signal having the on-level from the controller 300 is provided to the PMIC 310. FIG. 4 illustrates that the first driving voltage EVDD is output to the driving voltage line DVL (see FIG. 3) through the data driving circuit SDIC, but without limitation, the first driving voltage EVDD can be output directly to the driving voltage line DVL (see FIG. 3) without passing through the data driving circuit SDIC.

By providing the first driving voltage EVDD having the second voltage level VED2 to the driving voltage line DVL, the amount of generated heat in the driving voltage line DVL is increased, thereby removing moisture from the driving voltage line DVL and the adjacent reference voltage lines RVL.

Figure 8:
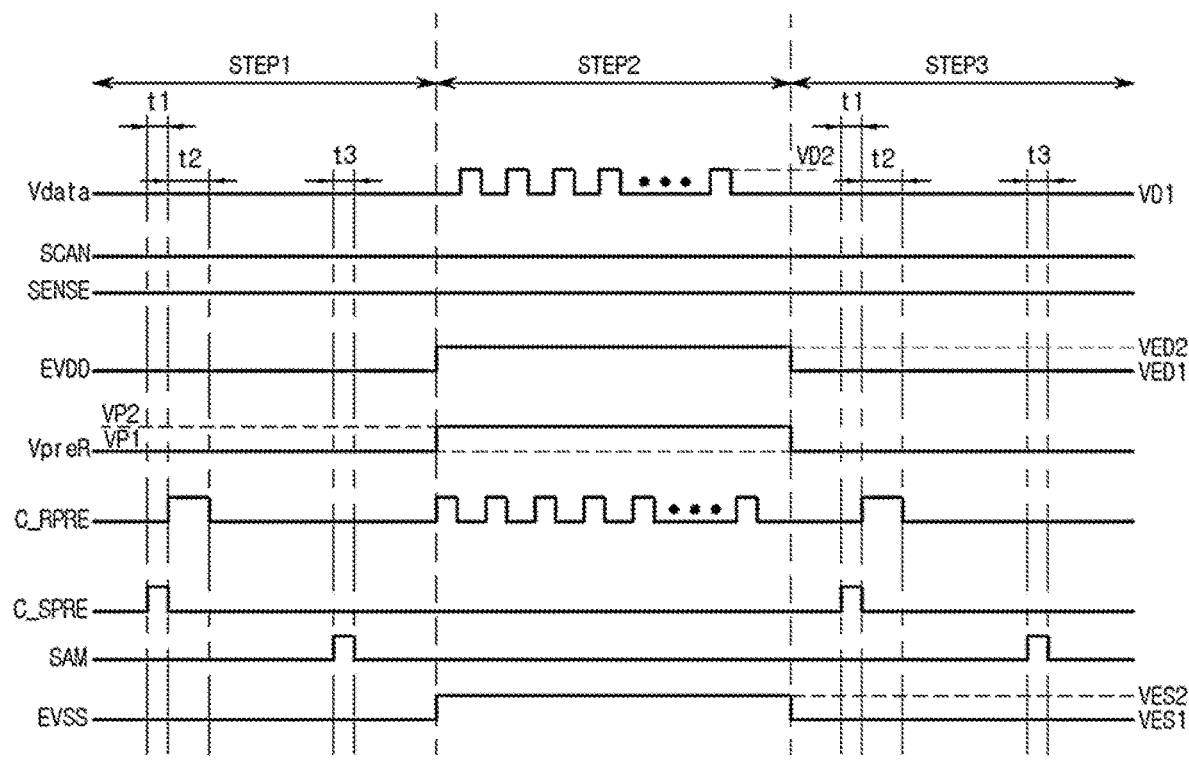
FIG. 8 is a waveform diagram of signals applied to a sub-pixel according to yet another embodiment of the present disclosure.

FIG. 8 is a waveform diagram of signals applied to a sub-pixel according to yet another embodiment of the present disclosure.

Referring to FIGS. 4 and 8, in the second step STEP2, a second driving voltage EVSS can be applied to the cathode of the light emitting diode OLED.

For example, the light emitting diode OLED can be driven when the difference between the first driving voltage EVDD applied to the anode and the second driving voltage EVSS applied to the cathode is higher than the driving voltage for the light emitting diode OLED. For example, the driving voltage can be about 7 to 8V. To prevent the light emitting diode OLED from being driven abnormally in the second step STEP2 due to the first driving voltage EVDD having the second voltage level VED2, the second driving voltage EVSS having a predetermined second voltage level VES2 can be applied to the second driving voltage EVSS so that the difference between the first driving voltage EVDD applied to the anode and the second driving voltage EVSS applied to the cathode is lower than the driving voltage of the light emitting diode OLED. The second driving voltage EVSS of the second voltage level VES2 can be greater than the first voltage level VES1 of the first step STEP1. FIG. 4 shows that the second driving voltage EVSS is output to the cathode through the data driving circuit SDIC, but without limitation, the second driving voltage EVSS can be output directly to the cathode without passing through the data driving circuit SDIC.

The third step STEP3 of reidentifying whether moisture permeates the reference voltage lines RVL can be performed in the same way as the first step STEP1. In other words, the third step STEP3 initializes the reference voltage lines RVL by turning on the reference voltage switch SPRE for sensing. The initialization of the reference voltage lines RVL can include applying the reference voltage VpreS for sensing to the reference voltage lines RVL. The reference voltage switch SPRE can be turned on in response to the on-level (e.g., the high level) of the first control signal C_SPRE and turned off in response to the off-level (e.g., the low level) of the first control signal C_SPRE. In the third step STEP3, when the first control signal C_SPRE has the on-level in the first period t1 and the reference voltage switch SPRE is turned on, the reference voltage VpreS for sensing is supplied to the reference voltage lines RVL.

Then, the reference voltage switch RPRE for driving is turned on. By turning on the reference voltage switch RPRE for driving, the reference voltage VpreR having the first voltage level VP1 is applied to the reference voltage lines RVL. For example, the second control signal C_RPRE can control the switching of the reference voltage switch RPRE for driving. The reference voltage switch RPRE for driving can be turned on in response to the on-level (e.g., the high level) of the second control signal C_RPRE and turned off in response to the off-level (e.g., the low level) of the second control signal C_RPRE.

In the second period t2 of the third step STEP3, when the first control signal C_SPRE has the off-level and the second control signal C_RPRE has the on-level, and the reference voltage switch SPRE for sensing is turned off, the reference voltage switch RPRE for driving is turned on, thereby supplying the reference voltage VpreR of the first voltage level VP1 to the reference voltage lines RVL.

The reference voltage VpreR of the first voltage level is charged in the capacitor CSEN for sensing. In other words, the voltage charged in the capacitor CSEN for sensing can have a level equal to the first voltage level VP1. After the reference voltage VpreR having the first voltage level is applied to the reference voltage lines RVL, the reference voltage switch RPRE for driving is turned off in response to the off-level (e.g., the low level) of the second control signal C_RPRE. When the reference voltage switch RPRE for driving is turned off, the voltage charged in the capacitor CSEN for sensing is discharged.

Then, in the third period t3 of STEP1, the sampling switch SAM is turned on to measure the voltage Vsen charged in the sensing capacitor CSEN connected to the reference voltage lines RVL.

For example, the third control signal C_SAM can control the switching of the sampling switch SAM. The sampling switch SAM can be turned on in response to the on-level (e.g., the high level) of the third control signal C_SAM and turned off in response to the off-level (e.g., the low level) of the third control signal C_SAM.

By measuring the voltage charged in the sensing capacitor CSEN connected to the reference voltage lines RVL, a discharging amount of voltage charged in the sensing capacitor CSEN connected to each of the reference voltage lines RVL can be identified.

Some reference voltage lines RVL among the plurality of reference voltage lines RVL can have a significantly different level of voltage charged in the sensing capacitor CSEN compared to other reference voltage lines RVL. In this case, some reference voltage lines RVL can be identified as short-circuited reference voltage lines RVL. For example, the reference voltage lines RVL whose level of the voltage charged in the capacitor CSEN for sensing is lower than the normal level can be identified as the reference voltage lines RVL which are short-circuited.

In the step STEP 3, when the reference voltage lines RVL which are short-circuited are not detected, the short-circuit failure preventing method of the reference voltage lines RVL is terminated. On the other hand, when the reference voltage lines RVL which are short-circuited are detected, the short-circuit failure preventing method of the reference voltage lines RVL can be continued or repeated.

In embodiments of the present disclosure, the various second steps STEP2 shown in FIGS. 5, 6, 7 and 8 can be performed individually, or in any order. Further, each method of the second step STEP2 shown in FIGS. 5, 6, 7 and 8 can be performed repeated individually, or two or more different methods can be performed either one time or in repeated series.

In embodiments of the present disclosure, additional heating shown in FIGS. 6, 7 and 8 can be used when it is determined that applying the reference voltage VpreR having the second voltage level VP2 to the reference voltage lines RVL did not remove permeated moisture based on the third step STEP3 of reidentifying whether the moisture permeates the reference voltage lines RV in FIG. 5. Accordingly, the additional heating shown FIGS. 6, 7 and 8 can be selectively performed, either sequentially by adding one additional heat source in a step wise manner, or all of the additional heat sources (FIG. 8) can be used at once the third step STEP3 of reidentifying whether the moisture permeates the reference voltage lines RV in FIG. 5 identifies permeated moisture still remains.

In other embodiments of the present disclosure, the heating shown in FIG. 8 can be used first to ensure that maximum heat is generated to remove permeated moisture from the reference voltage lines RVL, and when the third step STEP3 of reidentifying whether the moisture permeates the reference voltage lines RV in FIG. 5 identifies permeated moisture still remains, less heating shown in FIGS. 5, 6 and 7 can be subsequently used.

Although a few embodiments of the present disclosure have been described in more detail with reference to the accompanying drawings, it will be understood by a person having ordinary knowledge in the art to which the disclosure pertains that the different embodiments can be made without departing from the technical spirit or features. Accordingly, the embodiments of the present disclosure described above should be understood to be illustrative and non-limiting in all respects.

What is claimed is:

1. A method of addressing a short-circuit failure associated with reference voltage lines in a display device, the method comprising:
   identifying whether moisture permeates the reference voltage lines; and
   removing the moisture from the reference voltage lines based on identification of moisture permeation into the reference voltage lines,
   wherein the removing the moisture from the reference voltage lines comprises applying a reference voltage to the reference voltage lines,
   wherein the applying the reference voltage to the reference voltage lines comprises repeatedly turning on and off a reference voltage switch that applies the reference voltage to the reference voltage lines.

2. The method of claim 1, wherein the repeatedly turning on and off the reference voltage switch induces the sensing capacitors connected to the reference voltage lines to be charged and discharged using the reference voltage to induce a current flow in the reference voltage lines that generates heat.

3. The method of claim 2, wherein a second level of the reference voltage repeatedly applied to the reference voltages lines to generate heat is different from a first level of the reference voltage applied to the reference voltage lines to identify whether the moisture permeates the reference voltage lines.

4. The method of claim 3, wherein the second level of the reference voltage is approximately three to four times the first level of the reference voltage.

5. The method of claim 1, wherein the removing the moisture from the reference voltage lines further comprises applying a data voltage to a data line of the display device.

6. The method of claim 5, wherein the applying the data voltage to the data line comprises repeatedly applying a high signal and a low signal of the data voltage to induce a current flow in the data line.

7. The method of claim 6, wherein the removing the moisture from the reference voltage lines further comprises applying a first voltage to a first driving voltage line connected to a light emitting diode of the display device.

8. The method of claim 7, wherein the removing the moisture from the reference voltage lines further comprises applying a second voltage lower than the first voltage to a second driving voltage line connected to the light emitting diode of the display device.

9. The method of claim 7, wherein a difference between the first voltage and the second voltage is less than a driving voltage of the light emitting diode.

10. The method of claim 1, wherein the identification of the moisture permeation into the reference voltage lines comprises:
    initializing the reference voltage lines by applying a sensing reference voltage to the reference voltage lines;
    supplying the reference voltage of a first level to the reference voltage lines to charge sensing capacitors connected to the reference voltage lines;
    discharging the sensing capacitors connected to the reference voltage lines; and
    measuring voltages of the sensing capacitors connected to the reference voltage lines, and identifying the reference voltage lines having different levels of voltage charged to the sensing capacitors as ones having the moisture permeation.

11. The method of claim 1, further comprising re-identifying whether moisture permeates the reference voltage lines.

12. The method of claim 11, wherein the re-identifying whether moisture permeates the reference voltage lines comprises:
    initializing the reference voltage lines by applying a sensing reference voltage to the reference voltage lines;
    supplying the reference voltage of a first level to the reference voltage lines to charge the sensing capacitors connected to the reference voltage lines;
    discharging the sensing capacitors connected to the reference voltage lines; and measuring voltages of the sensing capacitors connected to the reference voltage lines to determine whether the reference voltage lines have different levels of voltage charged to the sensing capacitors.

13. A display device having a short-circuit failure preventing function for a plurality of reference voltage lines, the display device comprising:
a display panel including a plurality of pixels on a substrate, each pixel including a plurality of subpixels;
a data driving circuit electrically connected to the plurality of subpixels by a plurality of data lines;
a gate driving circuit electrically connected to the plurality of subpixels by a plurality of gate lines;
a source driver integrated circuit connected to the plurality of subpixels by the plurality of reference voltage lines; and
a controller to control the data driving circuit, the gate driving circuit, and the source integrated circuit,
wherein each subpixel includes:
a data line of the plurality of data lines, and connected to a data capacitor:
a driving voltage line;
a light emitting diode connected to the driving voltage line; and
a reference voltage line of the plurality of reference voltage lines, and connected to a sensing capacitor,
wherein, when performing the short-circuit failure preventing function under a control of the controller, a reference voltage is repeatedly applied to the reference voltage line to induce a current flow that generates heat to remove moisture from the reference voltage line that generates a short-circuit failure.

14. The display device of claim 13, wherein repeated application of the reference voltage is performed by repeatedly turning on and off a reference voltage switch that applies the reference voltage to the reference voltage line.

15. The display device of claim 14, wherein at least one of a data voltage being repeatedly applied to the data line and a driving voltage repeatedly applied to the driving voltage line is performed under the control of the controller to induce current flow in at least one of the data line and the driving voltage line to generate additional heat to remove the permeated moisture that generates the short-circuit failure.

16. The display device of claim 15, wherein the data voltage repeatedly applied to the data line alternates between a high signal and a low signal to induce the current flow in the data line.

17. The display device of claim 15, wherein the driving voltage repeatedly applied to the driving voltage line to generate additional heat is less than a driving voltage of the light emitting diode.

18. The display device of claim 13, wherein, under the control of the controller, identification of whether moisture has permeated into the plurality of reference voltage lines includes:
initializing the plurality of reference voltage lines by applying a sensing reference voltage to the plurality of reference voltage lines;
supplying the reference voltage of a first level to the plurality of reference voltage lines to charge sensing capacitors connected to the plurality of reference voltage lines, the reference voltage of the first level being different from the reference voltage of a second level that is repeatedly applied to the reference voltage line that induces the current flow that generates the heat;
discharging the sensing capacitors connected to the plurality of reference voltage lines; and
measuring voltages of the sensing capacitors connected to the plurality of reference voltage lines, and identifying some of reference voltage lines having different levels of voltage charged to the sensing capacitors as ones having the moisture permeation causing the short circuit failure.

19. The display device of claim 18, wherein the initializing the plurality of reference voltage lines is performed by activating a reference voltage switch for sensing connected between a reference voltage source and the reference voltage line,
wherein the supplying the reference voltage of a first level to the plurality of reference voltage lines is performed by deactivating the reference voltage switch for sensing, and activating a reference voltage switch for driving connected between the reference voltage source and the reference voltage line to supply the reference voltage of the first level to the plurality of reference voltage lines, and
wherein the measuring voltages of the sensing capacitors is performed by activating a sampling switch to measure voltages charged on the plurality of reference voltage lines and the sensing capacitors connected thereto.

* * * * *